(12) United States Patent
Balasubramanian et al.

(10) Patent No.: US 7,829,145 B2
(45) Date of Patent: Nov. 9, 2010

(54) METHODS OF UNIFORMITY CONTROL FOR LOW FLOW PROCESS AND CHAMBER TO CHAMBER MATCHING

(75) Inventors: Ganesh Balasubramanian, Sunnyvale, CA (US); Juan Carlos Rocha-Alvarez, Sunnyvale, CA (US); Tom K. Cho, Palo Alto, CA (US); Daemian Raj, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/256,405

(22) Filed: Oct. 22, 2008

(65) Prior Publication Data

US 2009/0047446 A1 Feb. 19, 2009

Related U.S. Application Data

(62) Division of application No. 11/130,554, filed on May 16, 2005, now Pat. No. 7,622,005.

(60) Provisional application No. 60/611,852, filed on Sep. 21, 2004, provisional application No. 60/574,823, filed on May 26, 2004.

(51) Int. Cl.
*C23C 16/00* (2006.01)

(52) U.S. Cl. ................... 427/255.28; 427/569

(58) Field of Classification Search ............ 427/255.28, 427/569
See application file for complete search history.

(56) References Cited

U.S. PATENT DOCUMENTS

| | | | |
|---|---|---|---|
| 5,360,144 A | 11/1994 | Slade | |
| 5,532,190 A | 7/1996 | Goodyear et al. | |
| 5,725,675 A | 3/1998 | Fong et al. | |
| 5,741,363 A | 4/1998 | Van Buskirk et al. | |
| 5,844,195 A | 12/1998 | Fairbairn et al. | |
| 5,871,586 A | 2/1999 | Crawley et al. | |
| 5,882,414 A * | 3/1999 | Fong et al. | 118/723 R |
| 5,950,925 A | 9/1999 | Fukunaga et al. | |
| 5,968,276 A | 10/1999 | Lei et al. | |
| 5,976,261 A | 11/1999 | Moslehi et al. | |
| 6,029,602 A | 2/2000 | Bhatnagar | |
| 6,079,356 A | 6/2000 | Umotoy et al. | |
| 6,079,426 A * | 6/2000 | Subrahmanyam et al. | 134/1.1 |
| 6,132,512 A | 10/2000 | Horie et al. | |
| 6,152,070 A | 11/2000 | Fairbairn et al. | |
| 6,182,603 B1 * | 2/2001 | Shang et al. | 118/723 ME |
| 6,190,732 B1 | 2/2001 | Omstead et al. | |
| 6,245,192 B1 | 6/2001 | Dhindsa et al. | |
| 6,274,495 B1 | 8/2001 | Omstead et al. | |
| 6,291,341 B1 | 9/2001 | Sharan et al. | |
| 6,302,964 B1 | 10/2001 | Umotoy et al. | |
| 6,364,949 B1 | 4/2002 | Or et al. | |
| 6,364,954 B2 | 4/2002 | Umotoy et al. | |
| 6,387,182 B1 | 5/2002 | Horie et al. | |
| 6,444,039 B1 | 9/2002 | Nguyen | |
| 6,454,860 B2 * | 9/2002 | Metzner et al. | 118/715 |
| 6,478,872 B1 * | 11/2002 | Chae et al. | 117/88 |
| 6,495,233 B1 * | 12/2002 | Shmurun et al. | 428/64.1 |
| 6,499,425 B1 | 12/2002 | Sandhu et al. | |
| 6,502,530 B1 | 1/2003 | Turlot et al. | |
| 6,508,197 B1 | 1/2003 | Omstead et al. | |
| 6,645,884 B1 * | 11/2003 | Yang et al. | 438/791 |
| 6,692,575 B1 | 2/2004 | Omstead et al. | |
| 6,827,815 B2 * | 12/2004 | Hytros et al. | 156/345.33 |
| 6,902,629 B2 | 6/2005 | Zheng et al. | |
| 7,550,381 B2 * | 6/2009 | Lu et al. | 438/655 |
| 2001/0054381 A1 | 12/2001 | Umotoy et al. | |
| 2002/0017243 A1 | 2/2002 | Pyo | |
| 2002/0092471 A1 | 7/2002 | Kang et al. | |
| 2003/0017268 A1 | 1/2003 | Hu et al. | |
| 2003/0132319 A1 * | 7/2003 | Hytros et al. | 239/548 |

(Continued)

FOREIGN PATENT DOCUMENTS

EP 0821084 1/1998

(Continued)

OTHER PUBLICATIONS

Boscher, Nicolas, et al., "Atmospheric pressure chemical vapor deposition of WSe2 thin films on glass-highly hydrophobic surfaces". Journal of Materials Chemistry, 2006, 16, pp. 122-127.*

(Continued)

*Primary Examiner*—Bret Chen
(74) *Attorney, Agent, or Firm*—Patterson & Sheridan, LLP (57) ABSTRACT

Apparatus and methods for distributing gases into a processing chamber are disclosed. In one embodiment, the method for processing a substrate includes delivering a processing gas into a chemical vapor deposition chamber through a first gas pathway that includes flow through a first plurality of apertures in a blocker plate, the blocker plate creating a pressure drop of at least approximately 0.8 torr thereacross, reacting the processing gas to deposit a material on a substrate surface, removing the substrate from the chamber, delivering a cleaning gas into the chamber through a second gas pathway around the blocker plate bypassing the blocker plate and through a second plurality of apertures formed in the blocker plate, and reacting the cleaning gases with deposits within the chamber to etch the deposits from the chamber.

16 Claims, 5 Drawing Sheets

U.S. PATENT DOCUMENTS

| | | | |
|---|---|---|---|
| 2003/0192568 A1* | 10/2003 | Zheng et al. | 134/1.1 |
| 2003/0198754 A1 | 10/2003 | Xi et al. | |
| 2004/0052969 A1 | 3/2004 | Lee et al. | |
| 2004/0144490 A1 | 7/2004 | Zhao et al. | |
| 2004/0216844 A1* | 11/2004 | Janakiraman et al. | 156/345.33 |
| 2005/0252447 A1* | 11/2005 | Zhao et al. | 118/715 |
| 2005/0263072 A1 | 12/2005 | Balasubramanian et al. | |
| 2009/0159001 A1* | 6/2009 | Um | 118/715 |

FOREIGN PATENT DOCUMENTS

| | | |
|---|---|---|
| EP | 0843339 | 5/1998 |
| JP | 61005515 | 1/1986 |
| JP | 05152208 | 6/1993 |
| TW | 527435 | 4/2003 |
| TW | 539761 | 7/2003 |
| TW | 583335 | 4/2004 |
| WO | WO-9966101 | 12/1999 |
| WO | WO-0104376 | 1/2001 |
| WO | WO-0116396 | 3/2001 |
| WO | WO-03065424 | 8/2003 |

OTHER PUBLICATIONS

Taiwan IPO Notice of Allowance and Search Report dated Apr. 25, 2008, Taiwan Patent Application No. 94116785.

PCT International Search Report and Written Opinion dated Dec. 24, 2008 for International Application No. PCT/US2008/79272.

Office Action dated Sep. 13, 2007, for U.S. Appl. No. 11/131,010.

Final Office Action dated Feb. 26, 2008, for U.S. Appl. No. 11/131,010.

Office Action dated Jul. 23, 2008, for U.S. Appl. No. 11/130,554.

Office Action dated Oct. 22, 2008, for U.S. Appl. No. 11/130,554.

Tiemessen, M. et al., "Fluorine induced formation of intermetal dielectric effects", *Advanced Semiconductor Manufacturing Conference and Workshop*, 1996, ASMC 96 Proceedings, IEEE/SEMI 1996 Cambridge, MA, USA Nov. 12-14, 1996, New York, NY, USA, IEEE, US, Nov. 12, 1996 pp. 303-307, XP010204545, IBSN: 0-7803-3371-3, "Equipment Commonality", p. 305.

PCT International Search Report for PCT/US03/39942, dated Jul. 12, 2004.

PCT International Search Report for PCT/US2005/017561, dated Aug. 18, 2005.

* cited by examiner

FIG. 5

# METHODS OF UNIFORMITY CONTROL FOR LOW FLOW PROCESS AND CHAMBER TO CHAMBER MATCHING

CROSS-REFERENCE TO RELATED APPLICATIONS

This application is a divisional of U.S. patent application Ser. No. 11/130,554 (APPM/009312), filed May 16, 2005 now U.S. Pat. No. 7,622,005, which claims benefit of U.S. Provisional Application Ser. No. 60/611,852, filed Sep. 21, 2004 and U.S. Provisional Application Ser. No. 60/574,823, filed May 26, 2004.

BACKGROUND OF THE INVENTION

1. Field of the Invention

Embodiments of the invention generally relate to semiconductor substrate processing systems. More particularly, embodiments of the invention relate to methods and apparatus for delivering gases into a processing chamber.

2. Description of the Related Art

During fabrication of integrated circuits and semiconductor devices, materials such as silicon oxides are typically deposited on a substrate within a process chamber, such as a chemical vapor deposition (CVD) chamber. A gas distribution plate in the chamber typically introduces gases into a reaction zone above the substrate. A blocker plate is often included prior to the gas distribution plate to assist in distribution of gases. A typical blocker plate includes a plurality of spaced holes that aid in distributing the gases prior to passing through the gas distribution plate. Some deposition processes, such as those used to produce carbon doped silicon oxides, operate at reduced gas flow rates that can be a tenth the rates used in standard silicon oxide deposition processes such as using tetraethyloxysilane (TEOS). The low flow rates adversely affect the distribution of gases in single chamber platforms or double chamber platforms. Furthermore, cleaning gases need to flow at a high flow rate through or otherwise around the blocker plate in order to not significantly reduce the chamber cleaning rate, thereby increasing the amount of time it takes to clean the chamber, increasing the amount of cleaning gases consumed and reducing the number of substrates that can be processed in a given time (i.e., throughput). Therefore, a need exists for apparatus and methods for controlling the distribution of gases in a CVD chamber at low flow rates.

SUMMARY OF THE INVENTION

Embodiments of the invention generally provide apparatus and methods for distributing gases into a processing chamber. In one embodiment, the apparatus includes a gas distribution plate having a plurality of apertures disposed therethrough and a blocker plate having both a plurality of apertures disposed therethrough and a plurality of feed through passageways disposed therein. A first gas pathway delivers a first gas through the plurality of apertures in the blocker plate with sufficient pressure drop to more evenly distribute the gases prior to passing through the gas distribution plate. A bypass gas pathway delivers a second gas through the plurality of feed through passageways in the blocker plate and to areas around the blocker plate prior to the second gas passing through the gas distribution plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
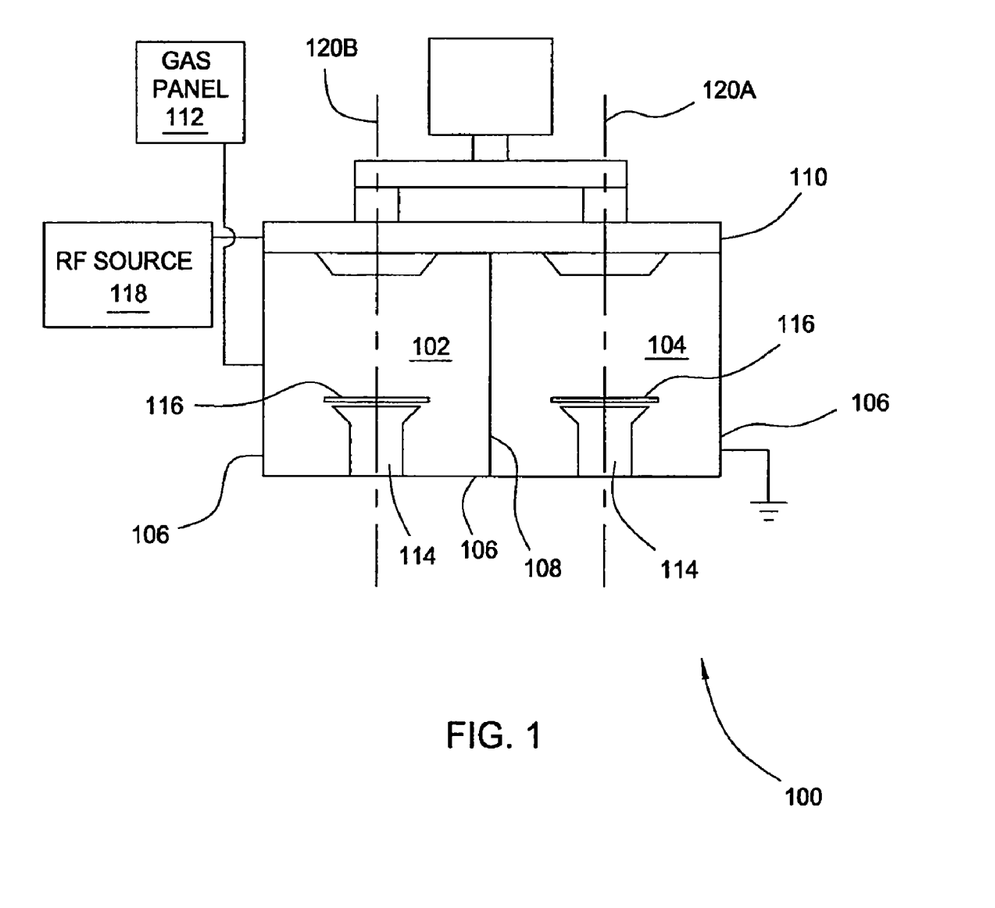
FIG. 1 is a schematic view of a chemical vapor deposition (CVD) system, which incorporates various embodiments of the present invention.

Embodiments of the invention generally relate to apparatus and methods for distributing gases into a processing chamber, such as a chemical vapor deposition (CVD) apparatus. FIG. 1 illustrates an exemplary CVD apparatus 100, which incorporates various embodiments of the invention. In general, the CVD apparatus 100 has two processing regions in one chamber, e.g., the Producer® chamber, which is commercially available from Applied Materials, Inc. of Santa Clara, Calif. The CVD apparatus 100 is described in detail in commonly assigned U.S. Pat. No. 6,495,233 B1, issued Dec. 17, 2002, which is incorporated herein by reference. Although embodiments of the invention are described with reference to the Producer® chamber, other CVD reactors and chambers may also be used to practice various embodiments of the invention, such as chambers having one processing region, e.g., the DXZ® Chamber, which is also commercially available from Applied Materials, Inc. of Santa Clara, Calif. The DXZ® Chamber is disclosed in commonly assigned U.S. Pat. No. 6,364,954 B2, issued Apr. 2, 2002, which is incorporated herein by reference.

The CVD apparatus 100 includes electrically grounded external walls 106, an internal wall 108, and a gas distribution assembly 110, which concurrently define a first chamber 102 and a second chamber 104. The internal wall 108 isolates the first and second chambers 102 and 104 from one another. Pedestals 114 disposed substantially centered within each of the chambers 102 and 104 support substrates 116. The substrates 116 rest on, or secure to, the pedestals 114 through the use of electrostatic force, mechanical or vacuum clamping, gravitational force or the like. A gas panel 112 couples to the CVD apparatus 100 and provides process and other gases as required for conventional CVD to occur within the first and second chambers 102 and 104. The CVD apparatus 100 may also couple to an RF source 118.

Figure 2:
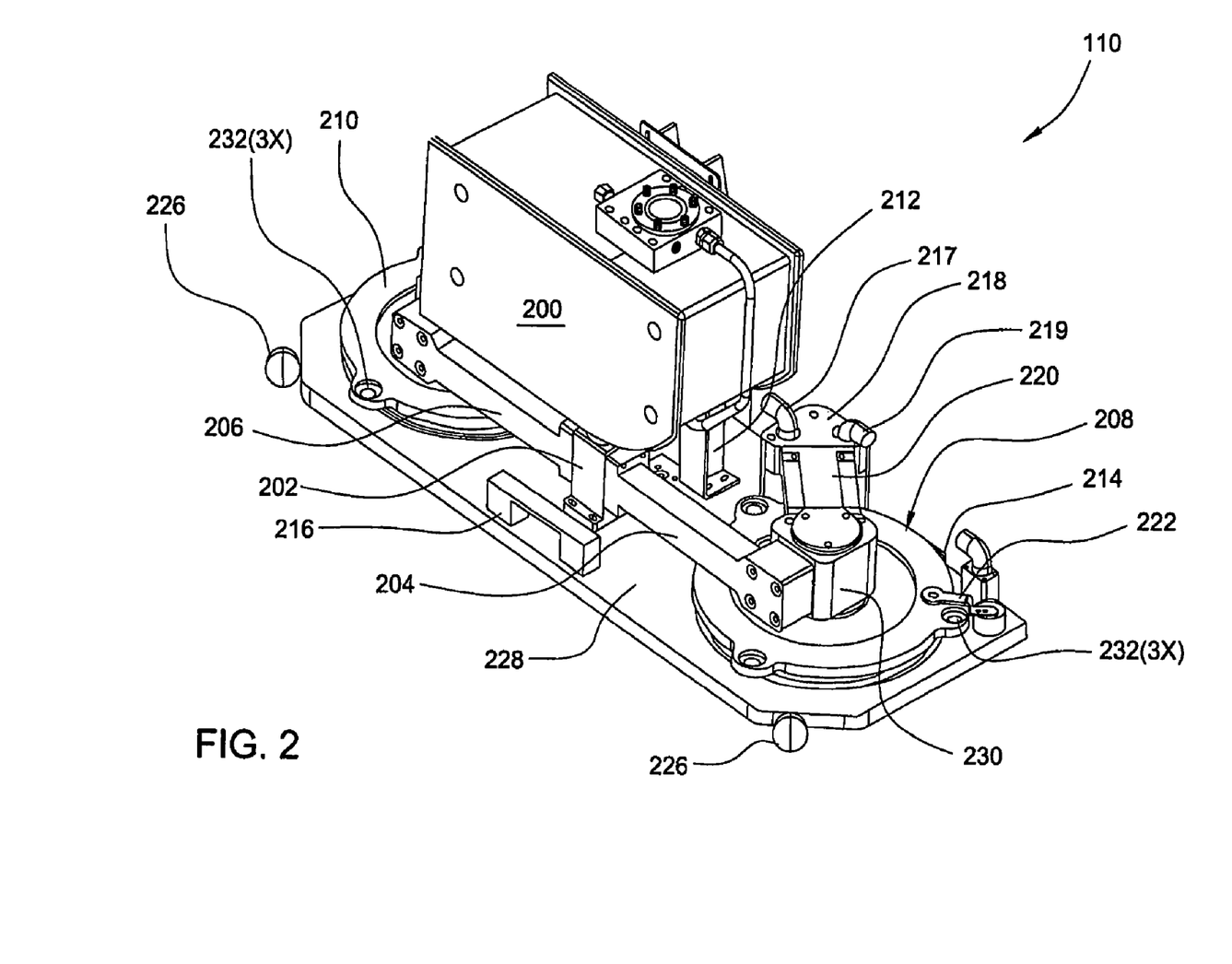
FIG. 2 is a perspective view of a gas distribution assembly for the CVD system, which incorporates various embodiments of the present invention.
Figure 3:
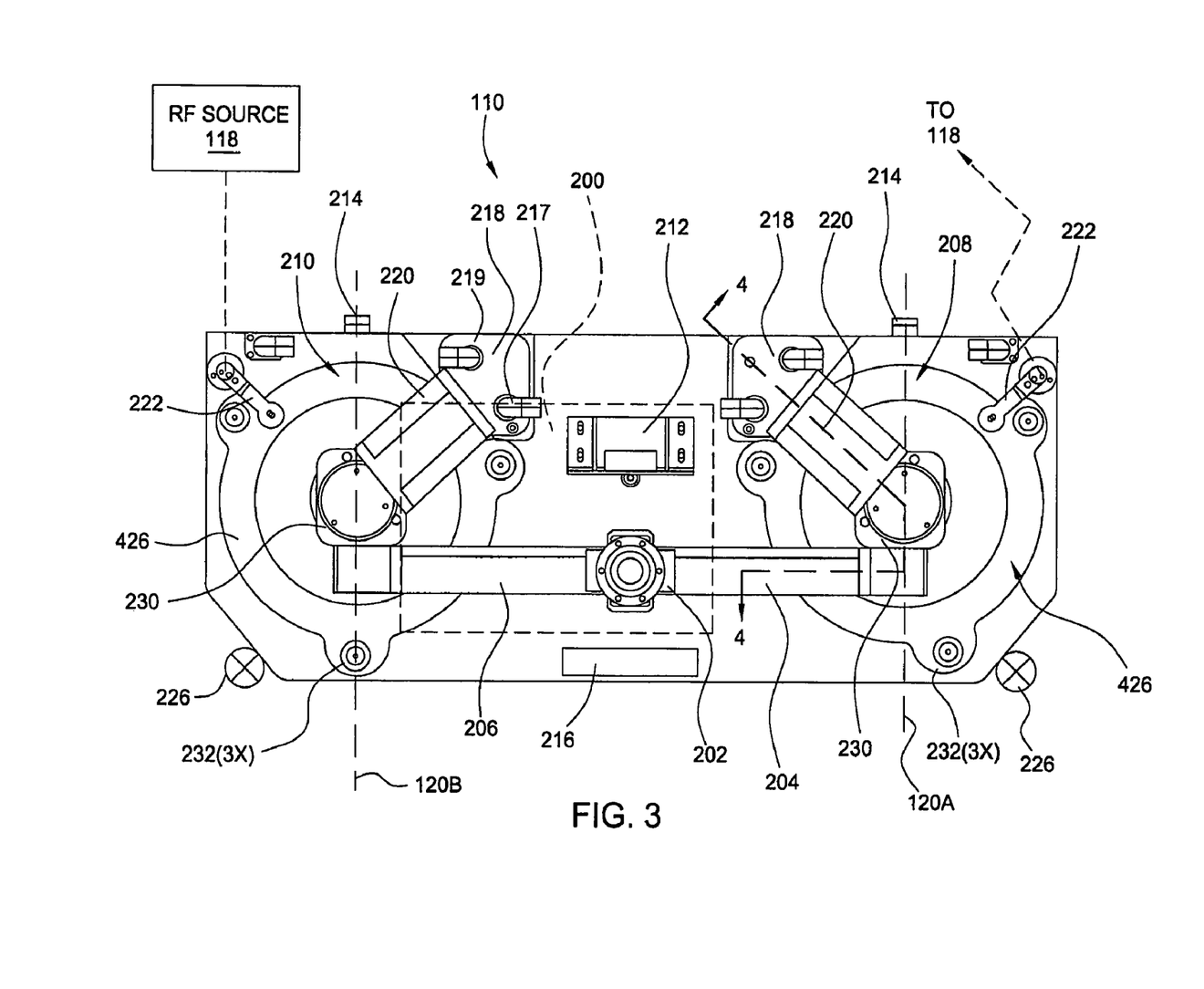
FIG. 3 is a top plan view of the gas distribution assembly, which incorporates various embodiments of the present invention.

FIGS. 2 and 3 illustrate perspective and top views of the gas distribution assembly 110. The gas distribution assembly 110 includes a lid plate 228, a first gas box 208, a second gas box 210, and a remote plasma source 200. The first gas box 208 is centrally disposed on the lid plate 228 along the chamber centerline 120A, and the second gas box 210 is centrally disposed on the lid plate 228 along the chamber centerline 120B. The lid plate 228 is generally fabricated from a conductive material, such as aluminum. The lid plate 228 affixes to one of the electrically grounded external walls 106 by one or more hinges 214, and a handle 216 facilitates opening of the lid plate 228. A fastening mechanism 226, i.e., a captive latch, secures the lid plate 228 to the chambers 102 and 104 when the gas distribution assembly 110 is in a closed position. The gas distribution assembly 110 additionally includes a pair of inlet manifolds 218 (one of which is partially obscured by the remote plasma source 200 in FIG. 2) and a pair of constant voltage gradient feed channels 220 (also, one of which is partially obscured by the remote plasma source 200 in FIG. 2). Each inlet manifold 218 disposed upon the lid plate 228 adjacent to each gas box 208 and 210 receives process gases from gas passages 424 that are in fluid communication with the gas panel 112 (shown in FIG. 1). The feed channel 220 defines a feed passage 425 (shown in FIG. 4) that connects each inlet manifold 218 to the respective gas box. Commonly assigned U.S. Pat. No. 5,725,675, which is incorporated herein by reference, fully describes an exemplary feed channel. The feed channel 220 electrically isolates the inlet manifold 218 from the gas boxes 208 and 210. To control the temperature of the gas distribution assembly 110, each inlet manifold 218 includes an inlet heat exchange fitting and an outlet heat exchange fitting 217 and 219, respectively, for circulating a cooling fluid, e.g., water. The cooling fluid circulates at a temperature range of about 65 degrees Celsius to about 70 degrees Celsius through channels (not shown) extending through each inlet manifold 218 and the gas distribution assembly 110.

The remote plasma source 200 delivers and sustains a cleaning gas for removing unwanted deposition material from the chambers 102 and 104. The cleaning gas may be a halogen-containing gas, such as a fluorine-containing gas. Preferably, the cleaning gas is $NF_3$. The processing conditions and ranges described herein for cleaning gases can be used with $NF_3$. Other cleaning gases that can be used include $F_2$, $CF_4$, $C_3F_8$, $C_2F_4$, $SF_6$, $C_2F_6$, $CCl_4$, and $C_2Cl_6$. The remote plasma source 200 may be an ASTRON® generator, which is commercially available from MKS Instruments, Inc, of Wilmington, Mass. A bracket 212 centrally supports the remote plasma source 200 above the lid plate 228. The bracket 212 fastens to the lid plate 228 by conventional means such as welding, riveting, machine screws and the like.

The remote plasma source 200 delivers the cleaning gas to the chambers 102 and 104 via a divider 202, a first conduit 204, and a second conduit 206. The divider 202 couples to the remote plasma source 200 and both the first conduit 204 and the second conduit 206 to form a "tee." The first conduit 204 couples the divider 202 to the first gas box 208 while the second conduit 206 couples the divider 202 to the second gas box 210. The first and second conduits 204 and 206 are fabricated from a dielectric material to electrically isolate the gas boxes 208 and 210 from the remote plasma source 200. The cleaning gas thus enters the respective chamber by flowing out of the remote plasma source 200 into the divider 202, then through the respective conduit and gas box into the respective chambers. Although the CVD apparatus 100 shown includes only a single remote plasma source 200, embodiments of the invention may be used with any chamber having any number of remote plasma sources. For example, commonly assigned U.S. Ser. No. 10/122,481, filed Apr. 12, 2002 and entitled "METHOD FOR CLEANING A PROCESS CHAMBER," which is incorporated herein by reference, describes a Producer® chamber with two remote plasma sources.

Figure 4:
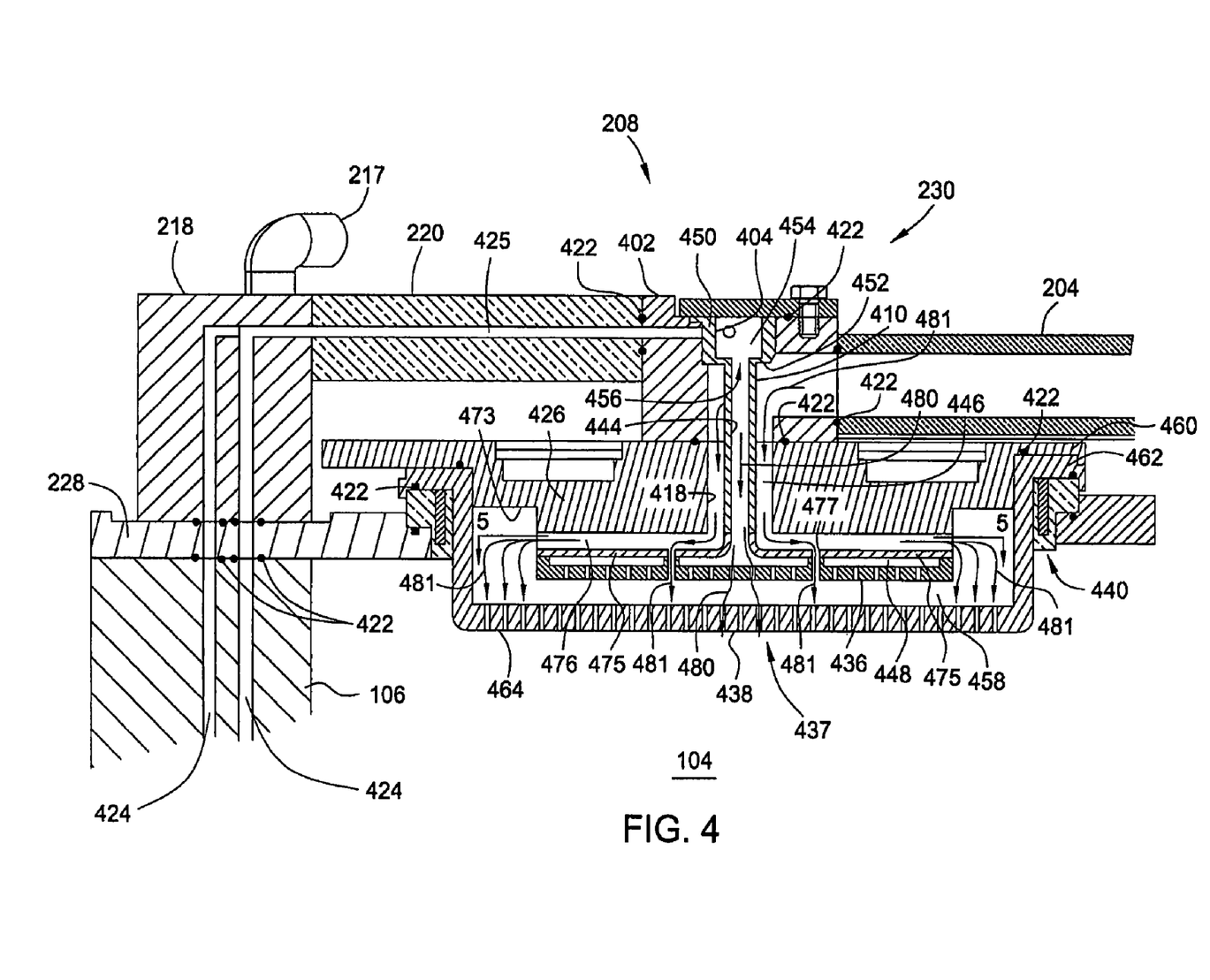
FIG. 4 is a partial cross section of the gas distribution assembly of FIG. 3 along a section line 4-4.

As shown in FIG. 4, the first gas box 208 (and the second gas box 210, which is visible in FIG. 2 and analogous to the first gas box 208) includes a mixing block 230, a mounting plate 426 and a showerhead 437. The showerhead 437 includes a blocker plate 436 and a generally dish-shaped gas distribution plate 438 having a perforated bottom 464. The mounting plate 426 includes a center aperture 418 and three mounting holes 232 for securing the mounting plate to the lid plate 228. The mounting plate and gas distribution plate 438 are fabricated from a conductive material, such as aluminum. RF coupling tabs 222 (shown in FIG. 3) couple the mounting plates 426 of the first and second gas boxes 208 and 210 to the RF source 118. The RF power couples through the mounting plate 426 to the gas distribution plate 438 since a rim 462 of the gas distribution plate 438 abuts against a flange 460 of the mounting plate 426. An isolator 440 disposed between the lid plate 228 and the gas distribution plate 438 and fabricated from an insulative dielectric material such as a fluoropolymer or ceramic electrically insulates the gas box 208 from the lid plate 228.

Figure 5:
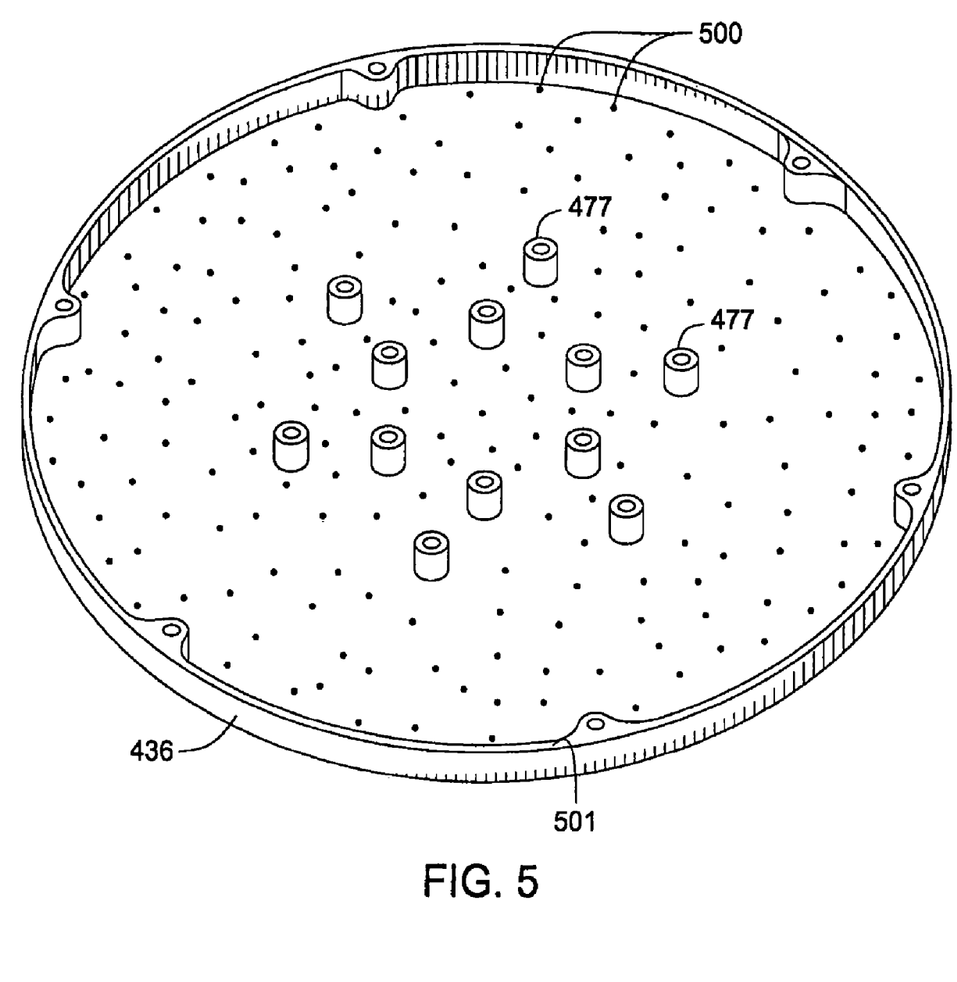
FIG. 5 is a perspective view of a blocker plate from the gas distribution assembly.

An inward shoulder 473 around the bottom perimeter of the mounting plate 426 defines a center portion 475 or protrusion of the mounting plate 426 spaced from and surrounded by the gas distribution plate 438. The blocker plate 436 couples to the bottom surface of the center portion 475 of the mounting plate 426. The blocker plate 436 includes an annular lip 501 (visible in FIG. 5) facing the mounting plate 426 that forms a gap 448 between the blocker plate 436 and the center portion 475 of the mounting plate 426. Thus, the blocker plate 436 that is perforated to allow gas passage enables build up of back pressure of the processing gases and radial diffusion of the processing gases within the gap 448.

The blocker plate 436 is a high pressure drop blocker plate in order to provide sufficient back pressure of the processing gases such as when depositing low dielectric constant material (e.g., Black Diamond™ processes commercially available from Applied Materials, Inc. of Santa Clara, Calif.). As defined herein, the high pressure drop blocker plate 436 is any blocker plate capable of causing a pressure differential thereacross of at least approximately 0.8 torr at a desired flow rate for deposition. This pressure differential can be achieved with the high pressure drop blocker plate 436 due to selection of the number of perforations and/or diameter of apertures 500 (see, FIG. 5) forming the perforations to achieve the desired differential. Accordingly, the number of holes (e.g., approximately 300 to 700) and the distribution of the holes in the blocker plate 436 can be related as a function of the total flow in the process. In one embodiment for deposition on a 300 mm substrate, the blocker plate 436 includes approximately 600 apertures and each of the apertures 500 has a diameter of approximately 16 mils.

TABLE 1

| Pressure Output Maniflod (torr) | Total Flow (sccm) | Delta P Blocker (torr) |
|---|---|---|
| standard blocker plate | | |
| 5.36 | 1410 | 0.36 |
| 5.36 | 1450 | 0.36 |
| 700 hole high pressure drop blocker plate | | |
| 5.8 | 1410 | 0.8 |
| 6.1 | 2160 | 1.1 |

TABLE 1-continued

| Pressure Output Maniflod (torr) | Total Flow (sccm) | Delta P Blocker (torr) |
|---|---|---|
| 7.7 | 3160 | 2.7 |
| 9.0 | 4160 | 4.0 |
| 10.3 | 5160 | 5.3 |
| 11.5 | 6160 | 6.5 |
| 12.7 | 7160 | 7.7 |
| 13.5 | 8160 | 8.5 |
| 14.1 | 9160 | 9.1 |
| 14.5 | 10160 | 9.5 |
| 300 hole high pressure drop blocker plate | | |
| 5.8 | 1000 | 0.8 |
| 6.1 | 1160 | 1.1 |
| 6.2 | 1410 | 1.2 |
| 6.7 | 2160 | 1.7 |
| 7.4 | 3160 | 2.4 |
| 8.1 | 4160 | 3.1 |
| 8.7 | 5160 | 3.7 |
| 9.3 | 6160 | 4.3 |
| 9.9 | 7160 | 4.9 |
| 10.5 | 8160 | 5.5 |
| 11.0 | 9160 | 6.0 |
| 11.7 | 10160 | 6.7 |
| 12.2 | 11160 | 7.2 |
| 13.3 | 13160 | 8.3 |
| 14.4 | 15160 | 9.4 |
| 15.5 | 17160 | 10.5 |

Table 1 compares the pressure differentials for various total flow rates through a standard blocker plate, a 700 hole high pressure drop blocker plate and a 300 hole high pressure drop blocker plate where the chamber pressure is maintained at a constant 5.0 torr.

In contrast to a standard blocker plate capable of causing a pressure differential thereacross of approximately 0.36 torr at a flow rate of 1410 standard cubic centimeters per minute (SCCM), the high pressure drop blocker plate 436 improves uniformity and deposition mismatch between the chambers 102, 104. Specifically, a film deposition uniformity ratio defined by the ratio of the high deposition thickness to the low deposition thickness across the substrate when using the standard blocker plate is about 3.0 in a first chamber and 2.6 in a second chamber compared to an ideal film deposition uniformity ratio of 1.0 where the deposition is completely uniform across the substrate. In contrast, the high pressure drop blocker plate 436 improves deposition uniformity as evidenced by a film uniformity of 1.1 in both chambers when a high pressure drop blocker plate with 500 holes each having a diameter of 16 mils is used. Furthermore, the high back pressure caused by the high pressure drop blocker plate 436 effectively controls flow splitting of the process gases to each of the two chambers. Specifically, the standard blocker plate provides a film thickness mismatch between the two chambers of 5% while the high pressure drop blocker plate 436 provides a film thickness mismatch between the two chambers of less than 1%.

Space between the blocker plate 436 and the gas distribution plate 438 defines a plenum 458. Thus, the perforated bottom 464 of the gas distribution plate 438 subjects the processing gases and the cleaning gases to a slight flow restriction that causes the various gases to further diffuse radially across the gas distribution plate 438 prior to passing into the chamber 104.

The mixing block 230 that is centrally disposed upon the mounting plate 426 distributes the processing gases from the feed passage 425 to a first flow path passing through the blocker plate 436 and distributes the cleaning gases from the first conduit 204 to a bypass flow path that bypasses the blocker plate 436. Arrows 480 illustrate flow through the first flow path, while arrows 481 illustrate flow through the bypass flow path. The mixing block includes a housing 402, a vortex generator 404, and a gas delivery tube 410. The vortex generator 404 includes a wall 450 and a bottom 452 that define a substantially cylindrical interior volume 454 having an exit aperture 456. Commonly assigned U.S. Pat. No. 6,495,233 B1, issued Dec. 17, 2002, which is incorporated herein by reference, describes in detail an exemplary vortex generator. A center passage 444 of the gas delivery tube 410 aligns with the exit aperture 456. The gas delivery tube 410 affixes to the bottom 452 of the vortex generator 404 and couples to the mounting plate 426 so that processing gases and other gases passing through the vortex generator 404 from the feed passage 425 flow through the first fluid path to the gap 448 ahead of the blocker plate 436. Additionally, the housing 402 defines an internal flow passage surrounding the delivery tube 410 and separated from the center passage 444 of the delivery tube 410. The internal flow passage through the housing 402 distributes flow from the first conduit 204 to the bypass flow path so that the cleaning gases and other gases from the first conduit 204 flow separately to the bypass flow path, as illustrated by arrows 481.

As shown in FIG. 4, the bypass flow path includes a plurality of radially extending bores or spokes 476 disposed in the center portion 475 of the mounting plate 426 and a plurality of feed throughs 477 (e.g., from 4 to 20) extending downward from inward locations along the spokes 476. The center aperture 418 through the mounting plate 426 includes an upper portion with an increased diameter defining an annular area 446 between the delivery tube 410 and the mounting plate 426 that enables fluid flow between the spokes 476 and the mixing block 230. The feed throughs 477 and the perforations in the blocker plate 436 can be designed with selected sizes and numbers such that a pressure drop across the perforations in the blocker plate 436 is greater than a pressure drop across the blocker plate 436 via the feed throughs 477 for a given flow rate. In one embodiment, the diameter of the bore of the spokes 476 is 0.35 inches and the diameter of the feed throughs 477 is 0.2 inches.

A series of o-rings 422 are disposed between the isolator 440 and the lid plate 228, the isolator 440 and the gas distribution plate 438, the mixing block 230 and the mounting plate 426, and the gas distribution plate 438 and the mounting plate 426 to ensure gas delivery into the respective chamber. The o-rings 422 are generally made of a material compatible with the processing and cleaning gases used in the CVD apparatus 100.

In operation, the substrates 116 are set upon the pedestals 114 in each of the chambers 102 and 104. A pump (not shown) evacuates the chambers 102 and 104. The processing gases are delivered to the mixing block 230 of each gas box 208 and 210, and thoroughly mixed in a cyclonic manner. Once mixed, the processing gases exit the mixing block 230 via the gas delivery tube 410, entering the respective chambers through the blocker plate 436 and the gas distribution plate 438. The processing gases then deposit a layer of material upon the substrates 116. In one embodiment, the layer of material may have a low dielectric constant, e.g. about 3 or less. Once the desired thickness of deposition is achieved, the processing gases are removed from the chambers 102 and 104.

Optionally, the deposition process may be enhanced by forming a plasma of the processing gases within the chamber. If desired, the optional RF power source 118 is coupled to the gas boxes via the RF coupling tabs 222. The RF power may be coupled to the gas distribution plate 438 to bias the gas distribution plate 438, thereby igniting and sustaining the plasma of the mixed processing gases within the chambers.

After the substrates 116 have been removed, the chambers may be cleaned using the remote plasma source 200, which is configured to generate the cleaning gases (i.e., in the form of free radicals). Once generated, the cleaning gases are delivered through the divider 202 and the conduits to the gas boxes. From the gas boxes, the cleaning gases flow through the center aperture 418 surrounding the gas delivery tube 410, through the spokes 476 and feed through 477, and through the gas distribution plate 438. As the cleaning gases flow through various components in the chambers, those components, including the gas distribution plate 438, are effectively scrubbed or etched of substantially all material that may have been deposited during the deposition process.

Embodiments of the invention described herein are not limited to any specific apparatus or to any specific plasma excitation method. Although embodiments of the invention are described with reference to a remote plasma source, embodiments of the invention may also be practiced in connection with other clean operations, such as an in-situ clean operation. The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in substrate support pedestal design, heater design, gas box design, remote plasma source design, location of power connections and others are possible.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
delivering a processing gas into a chemical vapor deposition chamber through a first gas pathway that includes flow through a first plurality of apertures in a blocker plate, the blocker plate creating a pressure drop of at least approximately 0.8 torr thereacross;
reacting the processing gas to deposit a material on a substrate surface;
removing the substrate from the chamber;
delivering a cleaning gas into the chamber through a second gas pathway around and bypassing the blocker plate and through a second plurality of apertures formed in the blocker plate; and
reacting the cleaning gases with deposits within the chamber to etch the deposits from the chamber.

2. The method of claim 1, wherein the pressure drop is greater than approximately 1.2 torr.

3. The method of claim 1, wherein delivering a processing gas occurs at a flow rate of less than 1500 sccm.

4. The method of claim 1, wherein delivering a processing gas occurs at a flow rate of less than 5000 sccm.

5. The method of claim 1, wherein the cleaning gas comprises a halogen-containing gas.

6. The method of claim 1, wherein the cleaning gas comprises a fluorine-containing gas.

7. The method of claim 1, wherein the cleaning gas comprises $NF_3$.

8. The method of claim 1, wherein the cleaning gas comprises a gas selected from at least one gas in the group consisting of $F_2$, $CF_4$, $C_3F_8$, $C_2F_4$, $SF_6$, $C_2F_6$, $CCl_4$, and $C_2Cl_6$.

9. The method of claim 1, further comprising forming a plasma of the processing gas within the chamber.

10. A method for processing a substrate, comprising:
delivering a cleaning gas into a chamber through a first plurality of gas pathways formed around and bypassing a blocker plate disposed in the chamber, the blocker plate creating a pressure drop of at least approximately 0.8 torr thereacross, wherein the delivering comprises delivering the cleaning gas from a center portion of a mounting plate disposed above the blocking plate to the first plurality of gas pathways formed around and bypassing the blocker plate; and
reacting the cleaning gases with deposits formed in the chamber to etch the deposits from the chamber.

11. The method of claim 10, wherein delivering the cleaning gas further comprises:
delivering a portion of the cleaning gas through a second plurality of gas pathways formed in the blocker plate.

12. The method of claim 10, further comprising:
delivering a processing gas into the chamber through a third plurality of pathways formed in the blocker plate before or after delivering the cleaning gas.

13. The method of claim 10, wherein the pressure drop is greater than approximately 1.2 torr.

14. The method of claim 10, the cleaning gas comprises a gas selected from at least one gas in the group consisting of $F_2$, $CF_4$, $C_3F_8$, $C_2F_4$, $SF_6$, $C_2F_6$, $CCl_4$, and $C_2Cl_6$.

15. The method of claim 10, wherein the cleaning gas comprises $NF_3$.

16. The method of claim 10, wherein the cleaning gas comprises a fluorine-containing gas.

* * * * *